United States Patent [19]  
Selak

[11] 4,128,326  
[45] Dec. 5, 1978

[54] CHEMICAL DISPENSING SYSTEM  
[75] Inventor: Martin M. Selak, Des Plaines, Ill.  
[73] Assignee: Astro Engineering Co., Skokie, Ill.  
[21] Appl. No.: 802,812  
[22] Filed: Jun. 2, 1977  
[51] Int. Cl.² ............................................. G03D 3/04  
[52] U.S. Cl. .................................. 354/317; 354/324; 354/328; 251/8; 251/9; 366/313; 366/325  
[58] Field of Search ............... 354/317, 318, 324, 325, 354/326, 328; 222/235, 236, 529; 251/7, 8, 9; 141/279; 366/312, 313, 325

[56] References Cited  
U.S. PATENT DOCUMENTS

| | | | |
|---|---|---|---|
| 1,927,886 | 9/1933 | Burns et al. | 354/317 |
| 2,167,952 | 8/1939 | Jordan | 251/7 |
| 2,356,865 | 8/1944 | Mason | 251/9 |
| 3,116,913 | 1/1964 | Lane | 366/325 |
| 3,593,641 | 7/1971 | Adams et al. | 354/317 |
| 3,608,464 | 9/1971 | Harrell et al. | 354/317 |
| 3,621,772 | 11/1971 | Bogue | 354/317 |
| 3,635,251 | 1/1972 | Gaines | 251/9 X |
| 3,682,078 | 8/1972 | Parker et al. | 354/317 |
| 3,893,600 | 7/1975 | Shields | 222/529 |

*Primary Examiner*—L. T. Hix  
*Assistant Examiner*—Alan Mathews  
*Attorney, Agent, or Firm*—Wallenstein, Spangenberg, Hattis & Strampel

[57] ABSTRACT

A chemical dispensing system having its most important use in dispensing flowable developing and finishing chemicals upon exposed lithographic printing plates comprises a supply container for each of the chemicals positioned immediately above the dispensing station therefor, each supply container containing continuously moving stirring means for keeping the chemical continuously in motion to homogenize the same. A number of flexible, laterally spaced dispensing tubes extend downwardly from each supply container, and a flow control valve is provided for each tube which pinches it into a closed position at a point near the container so that the volume of liquid which remains in the tube between the tube pinch point and the container is relatively small. The pinch valve comprises a unique combination of adjusting screws, a pressure-applying member and a spring member to control the closing pressure on each dispensing tube and the limited degree to which the tube is released, to permit small accurately controlled amounts of chemical to be dispensed through the dispensing tube. The spring member, upon release of closing pressure on each tube springs out to shake loose and distribute any particles which have settled out in the tube, to avoid clogging and to homogenize the chemical involved when it flows through the valve.

20 Claims, 9 Drawing Figures

CHEMICAL DISPENSING SYSTEM

BACKGROUND OF THE INVENTION

The present invention relates to the dispensing of chemicals, and has its most important application to the dispensing of developing and finishing chemicals upon the ultraviolet light exposed surfaces of lithographic-offset printing plates. Such printing plates are commonly formed by a process involving the exposure of selected areas of a photosensitive material coated on the plates. Images are developed on each plate by applying a developing liquid thereto which removes the unexposed portions of the photosensitive coating of the plate. To minimize the cost of making such printing plates, the application of developing and finishing chemicals to these plates has been heretofore carried out on a semi-automated basis. Thus, printing plate developing equipment is generally utilized wherein each printing plate, after exposure to ultraviolet light through a negative, is presented to the inlet station of the equipment which includes a conveyer for moving the exposed plate continuously past a developing station where a developing chemical is desirably evenly applied thereto, a washing station where the developing chemical is washed from the surface of the plate, and finally to a finishing station where a finishing chemical is desirably evenly applied thereto.

This equipment has left much to be desired from the standpoint of its reliability of operation, and ease of maintenance and set-up for operation. For example, the printing and finishing chemicals have been heretofore applied to the exposed printing plates by controlling the opening and closing of a valve to which the developing or finishing chemical is fed under pressure by a pump. Supply conduits extend from the control valve and one or more dispensing tubes remotely located from the valve. A number of such dispensing tubes are commonly laterally spaced across the chemical dispensing station involved for dropping small amounts of the chemical involved at different points across the width of the printing plate moving longitudinally past the same. Spreader brushes are used to spread the chemical evenly across the plate. It is especially important that the amount of developing chemical which is dispensed across the width of each plate be uniform, and so it is important that each dispensing tube discharges about the same amount of developing chemical and with the same viscosity or concentration. The valves which control the flow of the chemical to the various remote dispensing tubes normally operate automatically as the printing plate is fed to the input station of the equipment, where a micro-switch is located for opening the valve until the plate passes thereby.

The developing and finishing chemicals generally comprise a carrier liquid with distributed particles of the developing or finishing chemical therein which can settle out therefrom. Therefore, if an appreciable amount of time lapses between the feeding of successive printing plates to the inlet station of the equipment, the developing or finishing chemical remaining in various parts of the conduit system leading to and extending from the control valve will become non-homogeneous, as the particles in the carrier liquid settle out, sometimes even clogging the valve or conduit to a point where less than the desired flow rate of the chemical is obtained. In such case, when the next printing plate is applied to the equipment, at least the initial onrush of the chemical will be inadequate or non-homogenous and of an undesired concentration. Of course, the equipment could be designed so that the initial onrush of the chemical being dispensed is dropped ahead of the printing plate if the system is not completely clogged, but this complicates the design of the equipment and is wasteful of the chemical and/or slows down the speed of the equipment. Also, the use of a pump to feed the chemical through a conduit system over different conduit lengths can result in unequal discharge pressures at each dispensing tube, resulting in different amounts of chemical dispensed across the width of each printing plate.

It is, accordingly, one of the objects of the present invention to provide a chemical dispensing system, most advantageously one having utility in dispensing developing and finishing chemicals to a printing plate developing system as described, which minimizes or avoids problems referred to, namely the varying or uneven concentration or value of liquid chemicals applied across the printing plate or other article involved.

A related object of the invention is to provide chemical dispensing equipment as described which has easy to operate set-up and flow rate adjustment controls so that the equipment can be set-up and used reliably with chemicals requiring different flow rates. A still further related object of the invention is to provide chemical dispensing equipment which makes it easy initially to flush out the equipment, to initially get rid of any undesirably thick or viscous settled out chemical which could otherwise clog up the equipment.

SUMMARY OF THE INVENTION

While gravity feeding of various liquid materials from a supply container through a multiplicity of dispensing tubes is old and well known in various environments like the one disclosed in U.S. Pat. No. 3,893,600, it is believed to be a unique aspect of the invention to dispense developing and finishing chemicals to printing plates in this way, and especially so where the supply container is disposed immediately close to the points where the printing or finishing chemical involved is to be dropped upon the printing plates, so that only short vertically extending conduits extend from the container. These conduits are most advantageously flexible tubes closed by pinch valves so that any solid materials in the developing or finishing chemicals will settle out at the points where the flexible tubes are pinched closed. It is important to this aspect of the invention that the chemical in the supply container be continuously stirred, so that the body of the chemical in the container remains in a homogeneous condition, independently of whether or not a printing plate is being fed through the printing plate processing apparatus involved. Therefore, the only solid materials which will settle out at the point where the flexible dispensing tubes are closed are those which had time to settle out since the valves were last opened in the relatively small volume of chemical contained in the dispensing tubes between the supply container and the closed portions of the tubes. Any initial flushing-out operation believed desired involves only the removal of this small amount of material in the dispensing tubes.

In accordance with another aspect of the invention, the pinch-clamp valve is uniquely designed to provide an easy set-up and control of the quantity of chemical which is dispensed by the valve when the valve is open. Moreover, the design of the pinch-clamp valve is such that it shakes loose and substantially homogenizes the chemical contained in the dispensing tube involved between the point where the tube is pinched and the supply container when the valve is opened, as by action of a spring member which shakes loose any of the settled particles and creates a turbulence which substantially homogenizes the small body of chemical involved. In the most preferred form of this aspect of the invention, the region of each dispensing tube to be pinched closed is positioned between a longitudinally extending pressure-applying arm, preferably pivoted adjacent to one end and urged by a cam or the like toward the dispensing tube at a point remote from its pivot axis. The pressure of the cam on the pressure-applying arm forces the dispensing tube against a flexible resilient member extending along the other side of the dispensing tube which is placed under tension thereby. At the point where each dispensing tube is to be pinched closed, the tube is also backed by a rigid shoulder against which the cam-forced pressure-applying arm forces the tube closed by a pinching action until the cam is moved into a pressure-relieving position. Then the maximum tension on the spring member is suddenly relieved, which applies a sudden inward force against the flexible dispensing tube which shakes loose any coagulated particles which have settled out therein and creates a turbulence which readily homogenizes or at least distributes the previously coagulated particles in the carrier liquid in the tube. The tension on the spring member and flexible tube is preferably only partially relieved as the pressure-applying arm is pressed by the spring member against an adjustable stop shoulder, so that the flexible tube is only partially opened to permit a small controlled amount of the chemical to pass through the tube opening provided when the pressure of the cam on the pressure-applying arm is relieved. The stop shoulder can be the end of an adjusting screw, the position of which determines the size of the tube opening.

A common cam shaft is preferably used for simultaneously applying a pressure to and relieving pressure from the pressure-applying arms of the pinch clamp valves involved. The movement of the cam shaft to its pressure applying and relieving positions is preferably under control of a micro-switch or the like in the path of movement of the leading and trailing edges of the printing plates fed into the processing apparatus of the invention. When the leading edge of a printing plate depresses the micro-switch, the cam shaft is continuously rotated to alternately open and close the various dispensing tubes spaced across the width of the printing plate passing thereby. If the motor energizing the cam shaft were then to be immediately de-energized, the cam shaft could stop in a position where the dispensing tubes are continuously open, so that the developing or finishing chemical involved would be discharged from the supply container unnecessarily, requiring more frequent filling of the supply container. In accordance with still another aspect of the invention, when the trailing edge of a printing plate leaves the micro-switch, the control circuit for the motor driving the cam shaft will automatically return and stop the cam shaft at a home position where the cam shaft closes all of the dispensing tubes.

The above and other objects, features and advantages of the invention will become apparent upon making reference to the specification to follow, the claims and the drawings.

DESCRIPTION OF EXEMPLARY EMBODIMENT OF THE INVENTION

Figure 1:
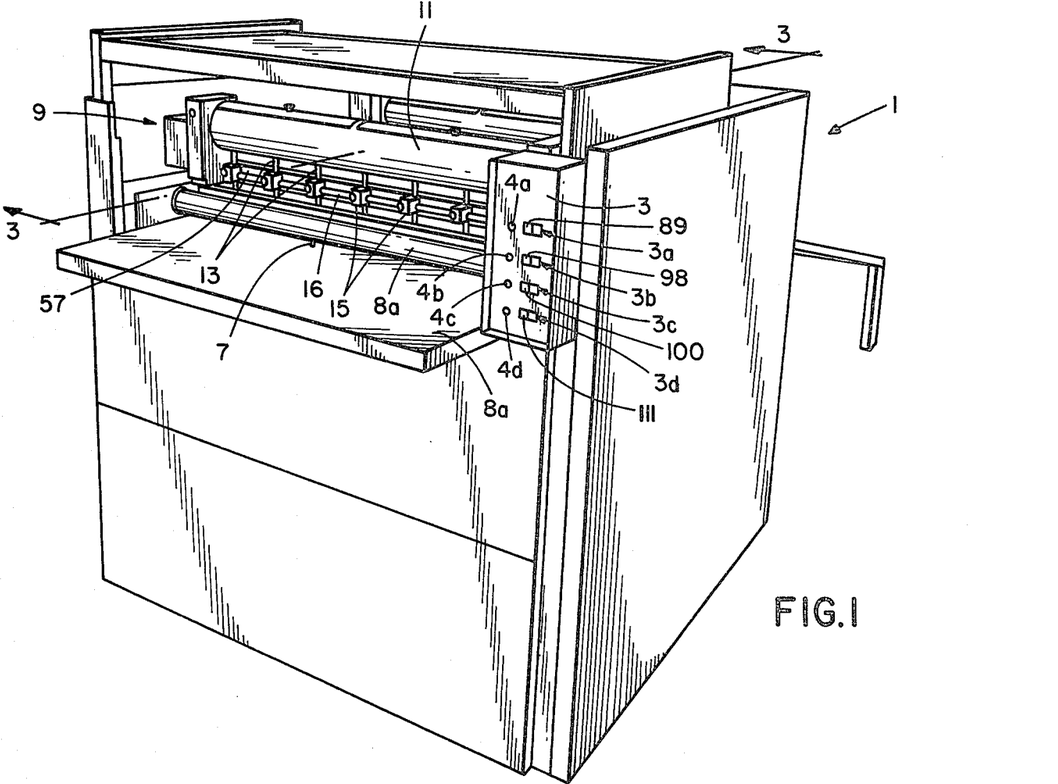
FIG. 1 is a perspective view of the printing plate processing unit constructed in accordance with a preferred form of the present invention.
Figure 2:
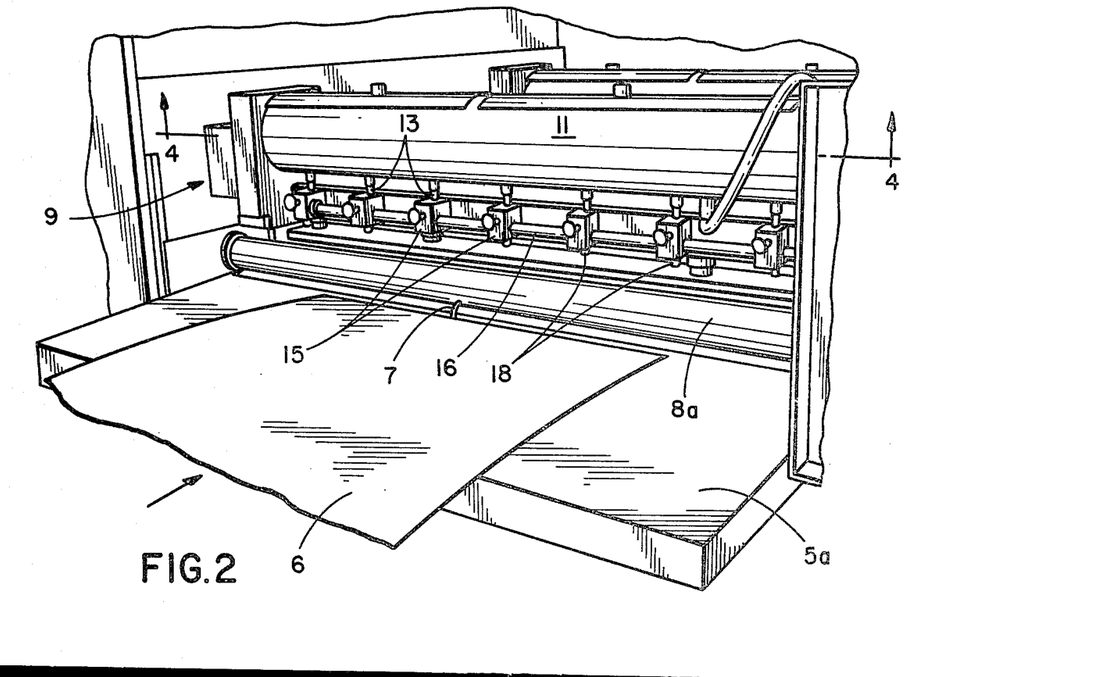
FIG. 2 is an enlarged perspective view of the inlet end of the printing plate processing unti shown in FIG. 1.
Figure 3:
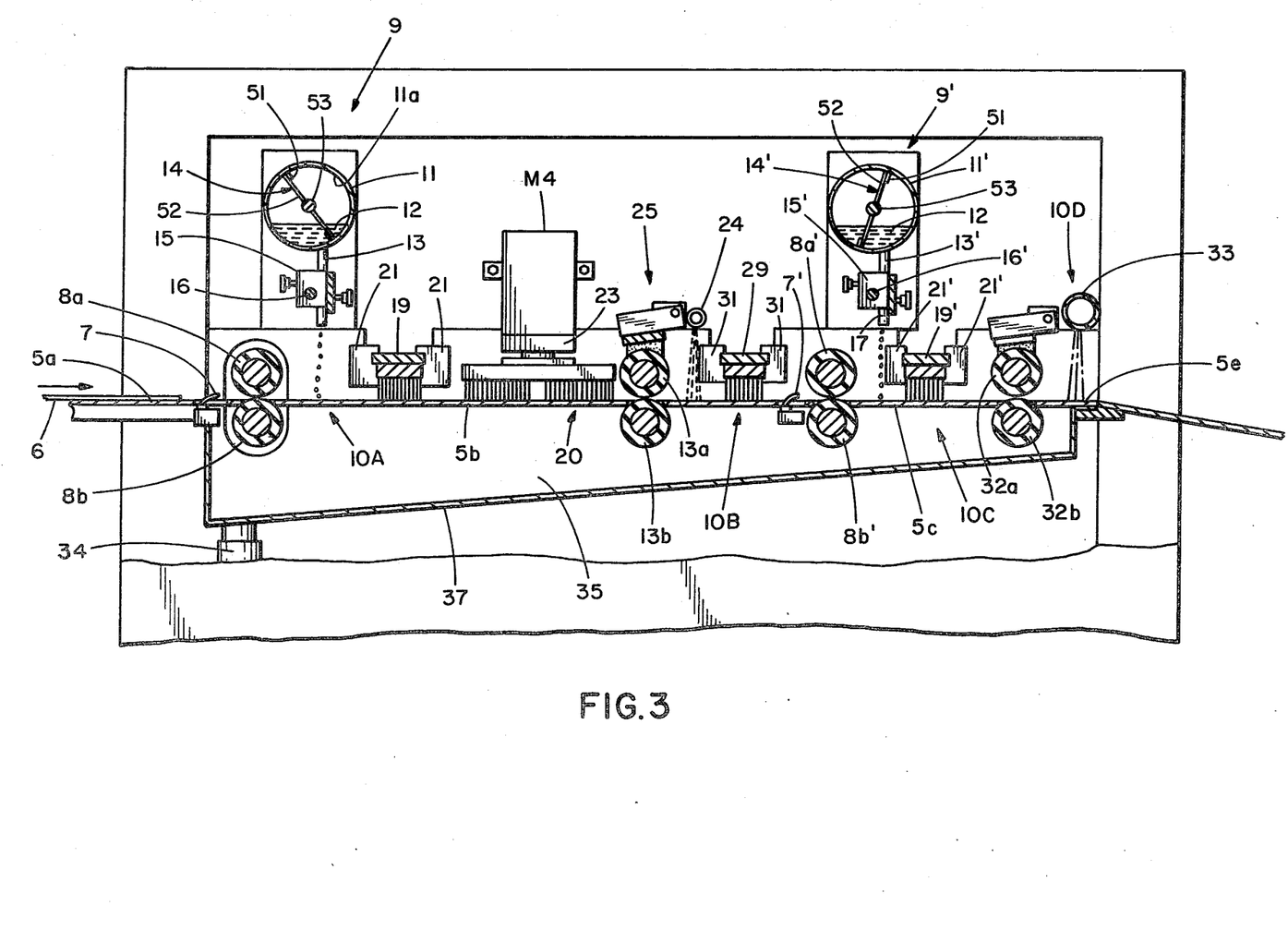
FIG. 3 is a sectional view through the processing unit shown in FIG. 1, taken along section line 3—3 therein.

Referring now more particularly to FIGS. 1 through 3, the exemplary printing plate processing unit of the invention there illustrated includes a housing 1 having a control box 3 with various controls 3a–3d and associated indicator lights 4a–4b for placing the processing unit into operation. The processing unit has a printing plate inlet platform 5 upon which the operator places an exposed printing plate for processing with the exposed photosensitive material coated side facing upwardly. The printing plate is pushed beneath a pair of oppositely rotating feed rollers 8a–8b which, together with other rollers and platform sections to be described, act as support and conveyer means for conveying each printing plate by various chemical dispensing, washing and drying stations to be described. As each printing plate is applied between the rollers 8a–8b, a micro-switch 7 in front of these rollers is depressed to render operative the feeding of developing chemical upon the printing plate in a manner to be described.

The developing chemical dispensing apparatus identified by reference numeral 9 is located immediately above the inlet end of the developing chemical dispensing station 10A (FIGS. 3–7). A plate feeding platform section 5b forms a horizontal extension of the inlet platform 5 on the outlet side of the feeding rollers 8a–8b and extends between the rollers 8a–8b and a driven set of rollers 13a–13b spaced from the rollers 8a–8b a distance less than the minimum length of the printing plates to be processed by the processing unit 1. The developing chemical dispensing apparatus 9 includes a supply tank or container 11 overlying the entire width of the inlet end of the plate feeding platform section 5b. The supply tank 11 has a storage space 11a holding a supply of a developing chemical 12 continuously kept in a stirred condition by stirring means 14. A group of relatively short, resilient, flexible dispensing tubes 13 extend downwardly from the bottom of the storage space 11a of the supply tank 11 at regular laterally spaced intervals. The chemical 12 flows into the tubes by gravity from the storage space 11a with which the tubes communicate. Control valve assemblies 15 alternately open and close the flexible dispensing tubes 13 in a manner to be described as long as the micro-switch 7 remains depressed, so that longitudinally and laterally spaced spots of developing chemical which dissolves the unexposed portion of the photosensitive printing plate coating are dispersed upon the upper surface of the printing plate fed past the chemical dispensing station 10A. (The developing chemical may be any well known form of developing chemical which generally includes a carrier liquid in which particles of the developing chemical remain in a suspended distributed condition throughout the carrier liquid, unless they have an appreciable period of time to settle-out.) The control valve assemblies 15 are adapted to close the flexible dispensing tubes 13 by pinching the same into a closed position and then releasing this pinching pressure to an adjustable degree to provide a very limited control opening in the dispensing tubes, to dispense the desired small amount of dispensing chemical each time the dispensing valve assemblies are operated to their tube-opening positions. These dispensing assemblies are simultaneously alternately operated to their tube-opening and tube-closing positions by a common cam shaft 16 driven in a manner to be described. As soon as the trailing edge of the printing plate leaves the micro-switch 7, the cam shaft 16 is returned to a home position where the dispensing valve assemblies 15 are operated to their tube-closing positions. However, the return of the micro-switch to its initial inoperative position, while preparing other functions for termination (like the feed of wash water and the drive of various feed rollers) will not effect this result until the printing plate involved has past completely through the processing unit.

These spots of developing chemical on the upper surface of each printing plate are evenly distributed in a lateral direction by a set of recriptocating brushes 19 which reciprocate laterally, and also in lateral and longitudinal directions by a set of rotating brushes 20 positioned on the outlet side of the reciprocating brushes 19. The reciprocating brushes 19 are shown in FIG. 3 guided for horizontal lateral movement in the channels of stationary guide blockes 21—21. The brushes 19 are secured to reciprocating rods 22—22 (FIG. 4) which are reciprocated in any suitable way, as by reciprocating means (not shown) driven by the same drive motor which drives the rollers 8a–8b and 13a–13b. FIG. 3 shows a separate motor M4 driving a transmission 23 which rotates the brushes 20.

A developed printing plate is delivered by the aforementioned feeding rollers 13a–13b to a relatively short platform section 5c underlying a water-feeding station 10B at which water is dispensed from the bottom of a supply conduit 24 upon the upper surface of the developed printing plate. This water is distributed over the upper surface of the printing plate moving past the washing station 10B by reciprocating brushes 29 operated in a similar way to the reciprocating brushes 19. The initiation of the flow of water through the supply conduit begins with the depression of the micro-switch 7 and terminates when the printing plate involved has past through the entire processing unit. Accordinly, a solenoid control valve controlled by a micro-switch operated time delay relay shown in FIG. 9 to be described is provided for controlling the flow of water through the supply conduit 24.

Following the application of the water to a printing plate, the printing plate passes over a micro-switch 7' and between a pair of driven feed rollers 8a'–8b' where it is supported on a relatively short platform section 5d underlying a finishing chemical dispensing station 10C at which a finishing chemical 12' is dispensed in the same way as the developing chemical 12 is dispensed. The finishing chemical, which generally includes gum arabic and asphaltum in a water liquid, after drying forms a water soluble surface which protects the printing plate until it is removed prior to its being inserted into a printing press. Thus, there is supported immediately above the inlet end of the platform section 5d a supply tank 11' containing a continuously stirred finishing chemical which drops by gravity into flexible resilient dispensing tubes 13' which are opened and closed alternately by suitable valve assemblies 15' operated by a common cam shaft 16' which is returned to a home tube-closing position when the micro-switch 7' returns to its initial raised position. Thus, spots of the finishing chemical are deposited on the printing plate at laterally and longitudinally spaced points along the surface of the printing plate. This chemical is then evenly distributed over the surface of the printing plate by suitable reciprocating brushes 19' operating in the same manner as the brushes 19 previously described. The printing plate then passes between a pair of driven feed rollers 31a–31b and upon a support plateform section 53 underlying a drying station 10D where a blower blows hot air through a conduit 33 down upon the printing plate to dry the finishing chemical.

The developing chemical and water which flow from the surface of the printing plate at the stations 10A and 10B drop into a collection space 35 below the platform sections 5b, 5c and 5d at the points where the aforementioned feed rollers pass through the spaces between the aforementioned platform sections 5b, 5c, and 5d. The liquid material flowing into the collection compartment 35 drops upon an inclined bottom wall 37 which carries the liquid to an outlet conduit 34.

As previously indicated, the present invention deals primarily with the unique construction and arrangement of the developing chemical and finishing chemical dispensing apparatus 9 and 9' briefly introduced above. Reference should now be made to FIGS. 4–9 which dislcose important details of the dispensing apparatus 9, it being understood that the corresponding finishing chemical dispensing apparatus 9' may have the identical construction as that shown in FIGS. 4–9.

The supply tank 11 is shown as a cylindrical tank having a pair of elongated openings 36a–36b at the top thereof through which the supply tank can be filled with the desired chemical. These openings 36a–36b are closed by removable covers 38a–38b. The supply tank 11 has a number of laterally spaced discharge passageways 39a communicating with the bottom of the supply space 11a within the supply tank 11 at a point appreciably spaced above the bottommost point in the tank. Each of the discharge passageways 39a are shown defined by short lengths of rigid conduit 39 which project below the supply tank. A flexible dispensing tube 13 is shown frictionally fitted around the projecting portion of each conduit 39.

The supply tank 11 has a relatively large drain passageway 48a formed by a short rigid conduit 48 projecting downwardly from the supply tank. The drain passageway communicates with the supply space 11a also at a point spaced appreciably from the bottommost portion of the supply tank. A flexible drain hose 50 is frictionally fitted about the projecting end portion of the rigid conduit 48. When it is desired to drain the supply tank 11, the hose 50 is dropped below the level of the chemical 12 in the tank 11. A pinch clamp (not shown) may normally close the hose 50, in which event, the hose can be placed at any elevation relative to the supply tank. The dispensing and drain passageways 39a and 48a are above the bottommost portion of the supply tank 11 so that most of the suspended particles of the developing chemical which settle out when the processing unit is dormant will drop to the bottommost points of the tank located between these passageways. Therefore, only a relatively small amount of the particles in the body of the developing chemical 12 in the tank will drop into these passageways 39a and 48a.

Figures 6, 7, 8:
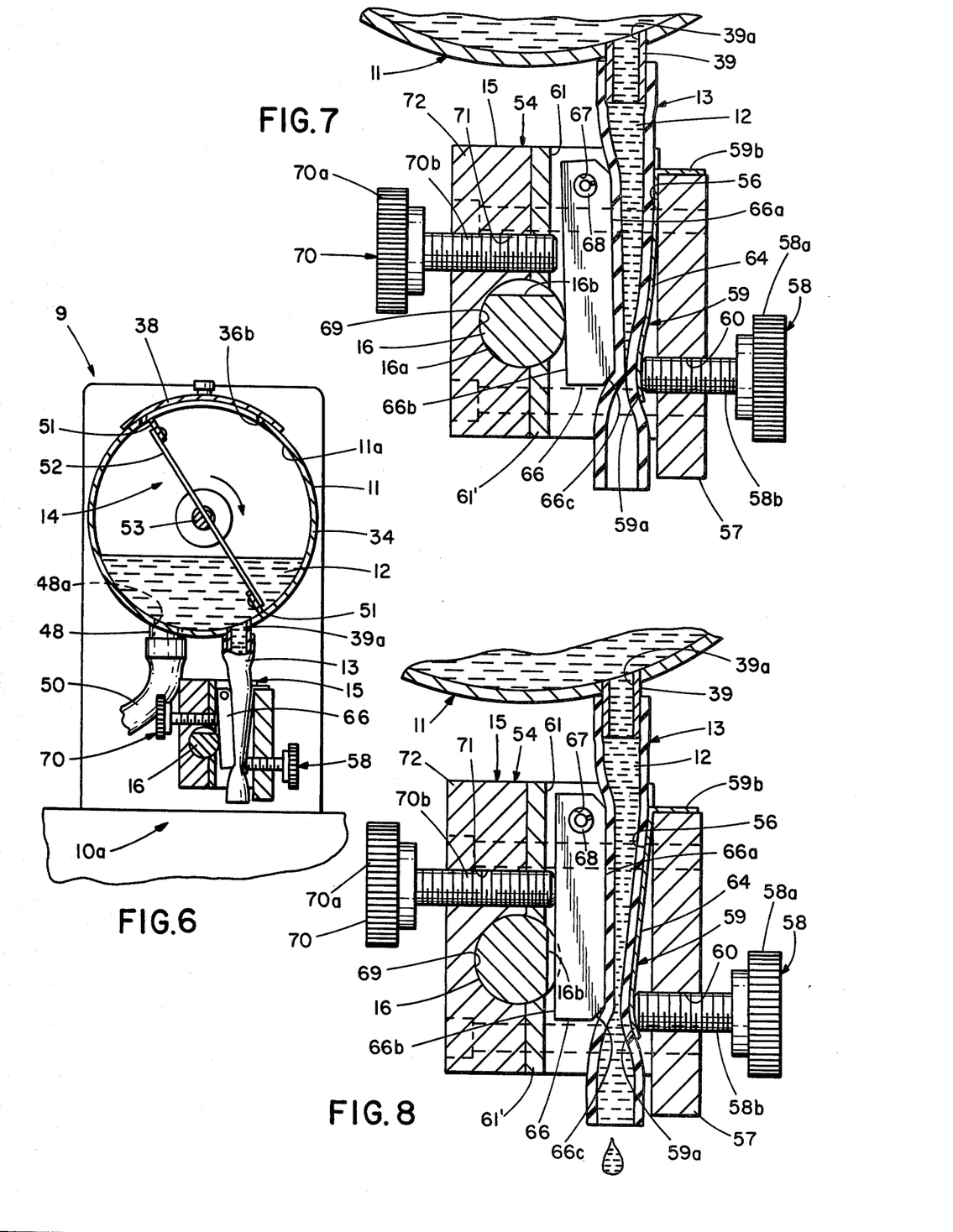
FIG. 6 is a sectional view through the developing chemical dispensing portion of the processing unit shown in FIG. 4, taken along section line 6—6 therein.
FIG. 7 is a greatly enlarged sectional view through a flexible dispensing tube and pinch valve portion of the processing unit shown in FIG. 4, taken along section line 7—7 thereof and showing the dispensing tube pinched closed by a unique pinch valve assembly of the present invention.
FIG. 8 is a view corresponding to FIG. 7 when the valve is operated to its dispensing tube-opening position.

Referring now more particularly to FIGS. 7 and 8, each control valve 15 which controls the opening and closing of a flexible dispensing hose 13 includes a valve body 54' having a tube-receiving recess 56 through which passes the associated flexible tube 13. A tube closure adjusting screw 58 having a knurled head 58a has a shank 58b threaded into a horizontal aperture 60 in a horizontal support bar 57. The end of the shank portion 58b projects within the tube-receiving recess 56. The end of the screw shank 58b engages the free end portion 59a of a leaf spring 59 whose opposite end portion 59b is bent around the corner of the valve housing at the upper end of the recess 56. The leaf spring extends along one side of the flexible tube 13. Mounted within the recess 56 is a pressure-applying member 66 having at its upper end portion an aperture 67 through which passes a pivot-forming rod 68 which pivotly supports the pressure-applying member. The pressure-applying member has a flat face 66a which engages the side of the flexible tube 13 opposite the side engaged by the leaf spring 59. A tube passage opening adjusting screw 70 is provided having a knurled head portion and a threaded shank portion 70b threaded within a horizontal aperture 71 formed in the valve body 54. The end of the shank portion 70b of the adjusting screw projects into the recess 56 of the valve body 54 to act as an adjustable shoulder varying the degree to which the pressure-applying member 66 can pivot in a direction away from the flexible tube 13.

Figures 4, 5:
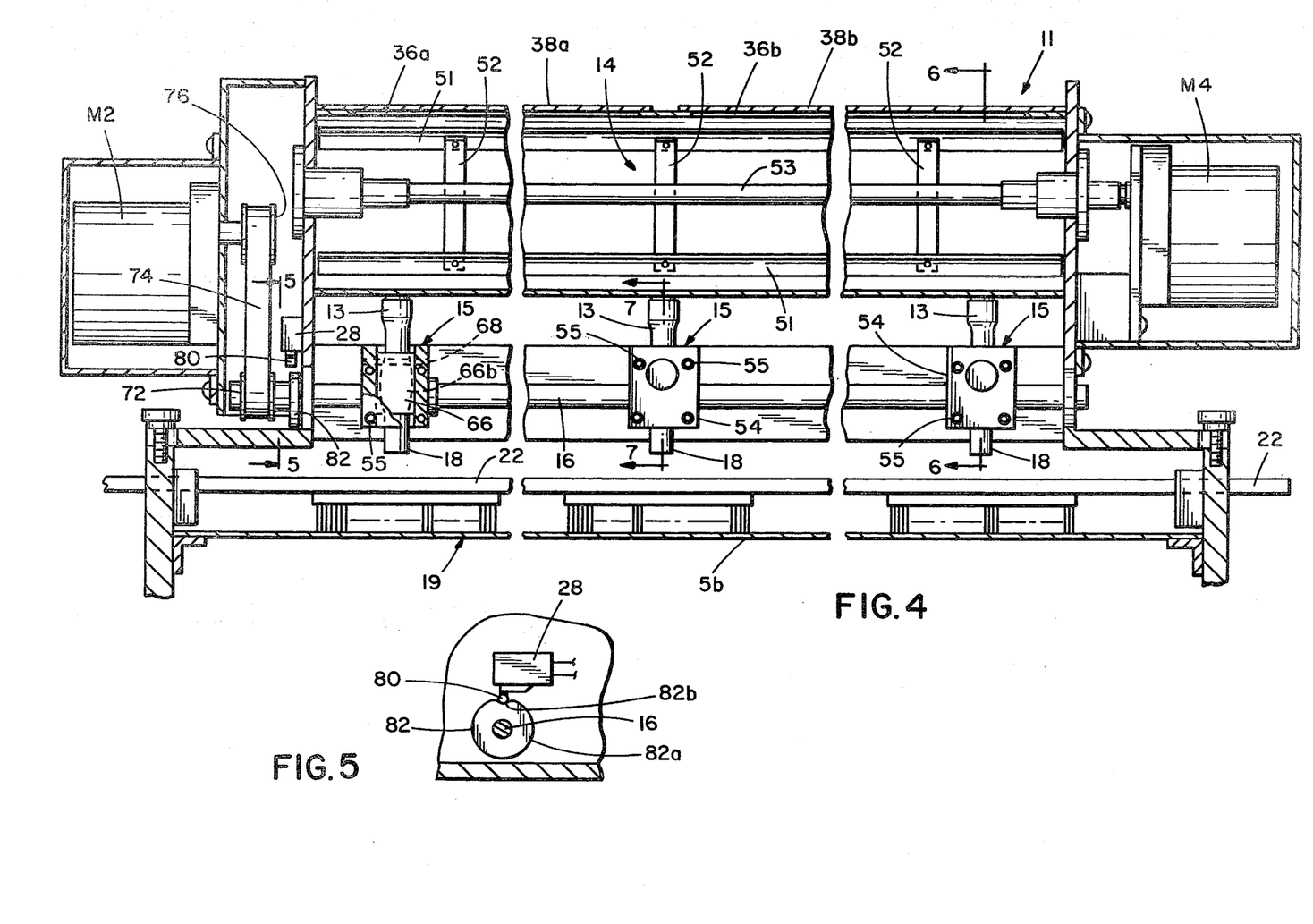
FIG. 4 is a vertical sectional view through the processing unit shown in FIG. 3, taken along section line 4—4 therein.
FIG. 5 is a fragmentary sectional view through the processing unit shown in FIG. 4, taken along section line 5—5 therein.

The pressure-applying member 66 is alternately moved in directions toward and away from the flexible tube by the aforesaid cam shaft 16 which projects through openings 69 in the valve bodies 54 of all of the control valves 15 in FIG. 4. The cam shaft 16 is held in place within each valve body 24 by anchoring plates 61—61'. The plates 61—61' and the valve body 54 are held together and upon the support bar 57 by screws 55. The cam shaft 16 has a cylindrical surface 16a which, when in engagement with the rear face 66b of the pressure-applying member 66, pinches the associated flexible tube 13 closed by pressing the same against the free end of the leaf spring 59 backed by the end of the adjusting screw 59 forming a rigid shoulder against which the flexible hose is pinched closed, as shown in FIG. 7. To avoid sharp edges projecting into the flexible tube 13, the pressure-applying member 66 has a bevel 66c formed in the lower front corner portion thereof. When the tube is pinched closed as shown, because of the leaf spring 59, the passageway 61 within the flexible tube has a progressively increasing cross sectional area proceeding from the closed portion of the tube. The cam shaft 16 has a flattened surface 16b which, when rotated to face the rear face 66b of the pressure-applying member 66, leaves contact with the pressure-applying member 66, which is then forced by the leaf spring 59 as well as by the resiliency of the flexible tube against the shoulder, formed at the end of the shank portion 70b of the adjusting screw 70 as shown in FIG. 8. Generally, the adjusting screw 70 will be adjusted so that the pressure-applying member 66 can move from its tube-closing position in FIG. 7 only to a relatively small extent before it is stopped by the end of the shank portion of the adjacent screw 70, so that only a very small passage opening 13a is formed in the flexible tube 13 for dispensing a relatively small amount of the developing chemical during the time the cam shaft 16 is in a position where it has dis-engaged from the pressure-applying member 66.

A very important feature of the control valve 15 shown is that when the cam shaft 16 is rotated into a position where it dis-engages from the pressure-applying member 66, the leaf spring 59 suddenly exerts a rearward force upon the wall of the flexible tube 13 which is engages, to shake loose any coagulated particles which may have settled within the previously closed portion of the tube and create a turbulence or stirring action which aids in the distribution of the settled-out particles throughout the body of the chemical 12 previously standing in the closed tube. As seen in FIG. 7, the flexible tube 13 extends only a short distance downwardly from the supply tank 11, and thus there is only a relatively small volume of the developing chemical 12 which is trapped in the tube when the tube is closed from which solid particles can settle-out. The leaf spring 59 extends over an appreciable proportion of the tube above the point where it is closed, so that the movement imparted thereby to the adjacent flexible tube walls will cause a stirring action over an appreciable length of the flexible tube within which the trapped body of developing chemical is located.

Referring now to FIG. 4, the cam shaft 16 has a pulley 72 secured to the end thereof around which pulley a drive belt 74 extends. The drive belt 74 passes around a pulley 76 driven by a motor M2. The energization of the motor M2 is, in part, controlled by switch 78 (FIG. 5) having a switch operating arm 80 rideable along the cylindrical portion 82a of a control cam 82. The cam 82 is carried by the cam shaft 16 and has a depression 82b. The operating arm 80 when engaging the cylindrical surface 82a of the cam 82 will cause the energization of the motor M2, independently of whether or not the micro-switch 7 is depressed. However, while the initial depression of the micro-switch 7 will initiate energization of the motor M2, the continued energization of the motor M2 will be effected by the switch 78 as long as the control arm 80 rides on the cylindrical surface of the cam 82. As the trailing edge of a printing plate passes beyond a micro-switch 7, the control arm 80 will remain in a position where the switch 78 continues the energization of the motor M2 until the control arm 80 rides in the depression 82b. The switch 78 and the cam 82 thus form a homing control which assures the return of the cam 16 to a home position shown in FIG. 7 where all of the flexible tubes 13 will be in a closed position after passage of a printing plate past the micro-switch 7, following a slight delay determined by the time it takes the cam shaft 16 to return to its home position.

Figure 9:
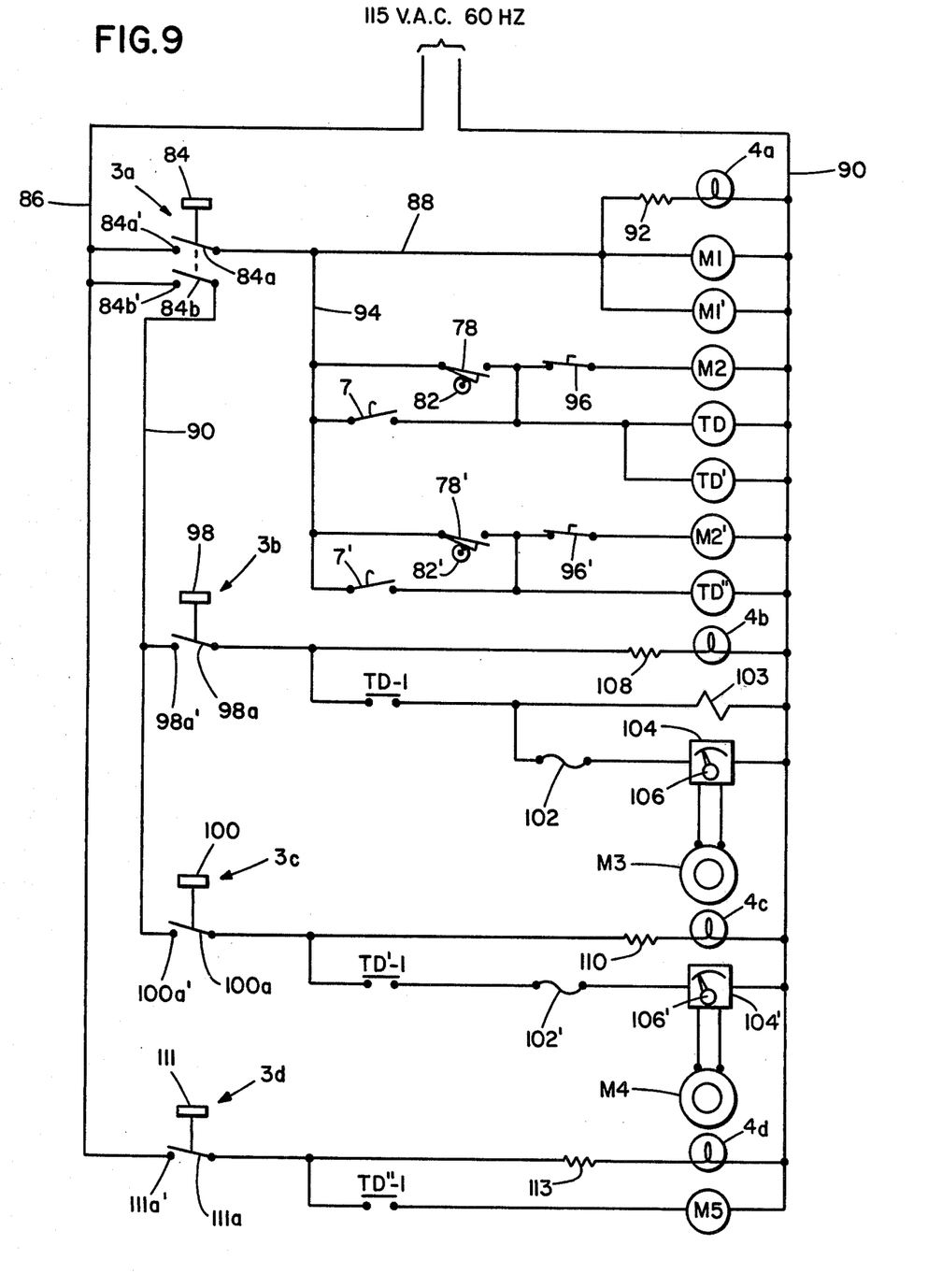
FIG. 9 is a circuit diagram of the control circuit which controls various motors driving the various moving parts of the processing unit shown in FIGS. 1 through 8.

Refer now to FIG. 9 which illustrates an exemplary control circuit for the processing unit just described. As there-shown, the control 3a includes, in addition to a toggle arm 84, a pair of movable contacts 84a and 84b cooperating with stationary contacts 84a' and 84b' to close respective branch circuits extending between a power input bus 86 and respective conductors 88 and 90. Conductor 88 is shown connected to corresponding terminals of motors M1 and M1' which respectively drive the shafts of the stirring means within the supply tanks 11 and 11' respectively. The opposite terminals of these motors are connected to the other input power bus 80. The conductor 88 also extends to a series circuit comprising a current-limiting resistor 92 and the indicator light 4a, in turn, connected to input power bus 90. It is thus apparent that closure of the contacts 84a—84a' result in the continuous operation of the stirring means referred to and energization of the indicator light 4a.

A conductor 94 extends between the conductor 88 and one of the terminals of the aforementioned cam switch 78 associated with the cam shaft drive motor M2, one of the terminals of a corresponding cam switch 78' associated with the cam shaft drive motor M2' which drives the cam shaft 16' associated with the finishing chemical dispensing apparatus 9', and one of the terminals of the micro-switches 7 and 7'. The other terminals of the cam switches 78 and 78' are shown respectively coupled through normally-closed toggle switches 96 and 96' (located at any suitable point within the housing 1) and cam drive motors M2 and M2' to the power bus 90. Said other terminals of the cam switches 78 and 78' are also respectively connected to the corresponding terminals of parallel connected time delay relays TD and TD', on the one hand, and time delay relays TD", on the other hand. The opposite terminals of these time delay relays are connected to the power bus 90. The unconnected terminals of the micro-switches 7 and 7' are respectively connected to the unconnected terminals of the cam switches 78 and 78' so that the cam switches are effectively connected in parallel with the micro-switches 7 and 7'.

Initially, the cam shafts 16 and 16' are in their home position where the switches 78 and 78' will be open. Operation of the micro-switches 7 and 7' by passage of the leading edge of a printing plate thereover will close these micro-switches respectively to energize the associated motor M2 and time delay relays TD and TD' on the one hand, and the motor M2' and time delay relays TD", on the other hand. As soon as the cam shafts 16 and 16' move from their home positions, the switches 78 and 78' will close and keep the circuits involved energized independently of the position of the micro-switches 7 and 7', until the cam shafts 16 and 16' return to their home positions.

The conductor 90 leading from the movable contact 84b extends to stationary contacts 98a' and 100a' respectively of the aforementioned controls 3b and 3c. These controls include movable contacts 98a and 100a which are closed by operation of associated toggle arms 98 and 100, respectively. The movable contacts 98a and 100a are respectivley connected through normally-open contacts TD-1 and TD'-1 of time delay relays TD and TD' to fuses 102 and 102', in turn, connected to one of the terminals of speed controllers 104 and 104' whose opposite terminals are connected to the power bus 90. The speed controllers 104 and 104' control the energization and speed of drive motors M3 and M4, respectively. The speed controllers 104 and 104' have motor speed adjusting control arms 106 and 106'. The motor M3 controls the various feed rollers previously described which convey the printing plates through the processing unit and the drive mechanism which reciprocates the brush-operating arms 22—22 (FIG. 4). The motor M4 drives the rotating brushes 20. A water control solenoid 103 is connected in parallel with the fuse 102 and speed controller 104, so that the solenoid 103 is energized and de-energized at the same time as the speed controller 103 and associated motor M3. The time delay relay contacts TD-1 and TD'-1 close quickly but open with a substantial delay when the associated relays are de-energized, so that the motors M3 and M4 will become de-energized only after a sufficient delay which permits the printing plate involved to be conveyed through the processing unit 1.

The movable contact 98a also connects to a current-limiting resistor 108 and the indicator light 4b, in turn, connected to the power bus 90. Accordingly, when the switch comprising the contacts 98a–98a' are closed, the indicator light 4b is energized and when the micro-switch 7 is depressed (i.e. closed) also, the water solenoid 103 and the speed controller 104 and associated motor M3 become energized. Similarly, when the switch comprising the contacts 100a–100a' is closed the indicator light 4c is energized and when the micro-switch 7' is also closed the speed controller 100' and the associated motor M4 becomes energized.

The power bus 86 also connects with a stationary contact 111a' of a switch including a movable contact 111a operated by a toggle arm 111 forming part of the control 3d. The movable contact 11a is coupled to the power bus 90 through a branch comprising a current-limiting resistor 113 and the indicator light 4d, and also through a branch comprising normally-open contacts TD"-1 of the time delay relay and a blower motor M5 which is the motor which effects the blowing of hot air through the aforesaid conduit 33. Thus, upon closure of the contacts 111a–111a', the indicator light 4d will become energized, and the motor M5 will become energized only upon subsequent closure of the micro-switch 7'. The blower motor M5 become de-energized when the micro-switch 7' returns to its initial open position upon passage thereby of the trailing edge of a printing plate and passage of a given time delay assuring the blowing of hot air upon all portions of the printing plate after the printing plate leaves the micro-switch 7'.

The normally closed toggle switches 96 and 96' are opened normally to de-energize the associated motors M2 and M2' after the cams 16 and 16' have moved from their home positions to leave the tubes in an open condition when it is desired to initially flush out the associated dispensing apparatus 9 or 9', or when it is desired initially to saturate a first printing plate applied to the processing unit to saturate the associated chemical spreading brushes 19—19'.

The present invention has thus provided an exceedingly easy to set-up and adjust, and reliable chemical dispensing system. It should be understood that numerous modifications can be made in the exemplary form of the present invention without deviating from the broader aspects thereof.

I claim:

1. A printing plate processing apparatus comprising, in combination: conveyer means having an inlet station for receiving exposed offset printing plates having photosensitive coatings thereon and which have been selectively exposed and for delivering said exposed printing plates to a developing station, a supply container having a storage space therein positioned immediately above and extending substantially the full width of said developing station for holding a supply of chemical having a liquid carrier in which is distributed particles therein which can settle-out therefrom, stirring means for continuously stirring the chemical in said supply container to keep said particles in dispersion within said liquid carrier, means for directing said chemical from said supply container to the printing plates on said conveyor means comprising only laterally spaced conduit means at the bottom portion of said container and extending substantially only vertically so that there are no horizontal runs in said conduit means and said chemical is delivered from said storage space by force of gravity, control valve means associated with each of said conduit means for opening and closing said conduit means, and printing plate position sensing means responsive to a printing plate being fed to said developing station for operating each control valve means to a position which opens the associated conduit means.

2. A printing plate processing apparatus comprising, in combination: conveyer means having an inlet station for receiving exposed offset printing plates having photosensitive coatings thereon and which have been selectively exposed and for delivering said exposed printing plates to a developing station, a supply container having a storage space therein positioned immediately above said developing station for holding a supply of chemical having a liquid carrier in which is distributed particles therein which can settle-out therefrom, stirring means for continuously stirring the chemical in said supply container to keep said particles in dispersion within said liquid carrier, means for directing said chemical from said supply container to the printing plates on said conveyer comprising laterally spaced conduit means extending downward from the bottom portion of said storage space for receiving said chemical from said storage space by force of gravity, control valve means associated with each of said conduit means for opening and closing said conduit means, the space between the point of said conduit means which is closed by said control valve means and the point at which said conduit means communicates with the bottom portion of said storage space in said supply container has said chemical trapped in said conduit means above the point where it is closed, means for stirring the chemical in each of said conduit means above each control valve means prior to or as each conduit means is opened by said control valve means, to distribute any settle-out particles therein before or as said chemical trapped in said conduit means starts flowing from each of said conduit means, and printing plate position sensing means responsive to a printing plate being fed to said developing station for operating each control valve means to a position which opens the associated conduit means.

3. The printing plate processing apparatus of claim 2 wherein each of said conduit means is a resilient flexible dispensing tube having an inlet and an outlet end; and each of said control valve means comprises first shoulder-forming means on one side of said tube and against which said tube is to be pinched closed, said first shoulder-forming means being progressively adjustable toward and away from said tube, a rigid pressure-applying member confronting said first shoulder-forming means on the opposite side of said tube, and valve operating means having a first position for forcing said pressure-applying member against said other side of the tube to press the tube against said first shoulder-forming means to pinch the tube closed thereat and a second position for relieving the tube-closing force on said pressure-applying member.

4. The printing plate processing apparatus of claim 3 wherein there is provided second shoulder-forming means on the side of said pressure-applying member opposite to the side facing said flexible tube and against which said second shoulder-forming means of said pressure-applying member may bear, the second shoulder-forming means being progressively adjustable toward and away from said pressure-applying member, the expansion of the flexible tube after closing pressure thereon by said pressure-applying member is relieved pressing said pressure-applying member against said second shoulder-forming means, the adjusted position of said second shoulder-forming means determining the size of the opening in said flexible tube when pressure is relieved thereagainst.

5. A printing plate processing apparatus comprising, in combination: conveyor means having an inlet station for receiving exposed offset printing plates having photosensitive coatings thereon and which have been selectively exposed and for delivering said exposed printing plates to a developing station, a supply container having a storage space therein positioned immediately above said developing station for holding a supply of chemical having a liquid carrier in which is distributed particles therein which can settle-out therefrom, stirring means for continuously stirring the chemical in said supply container to keep said particles in dispersion within said liquid carrier, means for directing said chemical from said supply container to the printing plates on said conveyer comprising laterally spaced conduit means extending downward from the bottom portion of said storage space for receiving said chemical from said storage space by force of gravity, each of said conduit means being a resilient flexible dispensing tube having an inlet and an outlet end; control valve means associated with each of said conduit means for opening and closing said conduit means, and each of said control valve means comprising a resilient backing member extending along one side of said tube, a first shoulder on said one side of said tube adjacent to said resilient backing member at the outlet end of a portion thereof to be placed under tension and against which shoulder said tube is to be pinched closed, a rigid pressure-applying member confronting said resilient backing member and shoulder on the opposite side of said tube, and valve operating means having a first position forcing said pressure-applying member against said other side of the tube to press the tube against said portion of said resilient backing member to place the same under tension and also against said first shoulder to pinch the tube closed thereat, and a second position for relieving the tube closing force on said pressure-applying member whereby the tension in said resilient backing member is suddenly released to force the adjacent side of the tube inwardly, to shake loose any settled particles in the tube between the previously closed pinched portion thereof and the inlet end of the tube to disperse such settled particles throughout the body of liquid involved; and printing plate position sensing means responsive to a printing plate being fed to said developing station for operating each control valve means to a position which opens the associated conduit means.

6. The dispensing valve assembly of claim 5 wherein said valve operating means is a common cam shaft having a first surface portion opposite the pressure-applying member of each control valve means which engages and forces said pressure-applying member against the associated tube when the valve operating means is in said first position and a second surface portion thereat which is out of engagement with said pressure-applying member when the valve operating means is in said second position.

7. The printing plate processing apparatus of claim 5 wherein said first shoulder is progressively adjustable in directions toward and away from said dispensing tube.

8. The printing plate processing apparatus of claim 5 wherein the pressure-applying member of each control valve means is pivoted at an end portion thereof remote from said first shoulder, and said valve operating means in said first and second positions respectively applying and relieving said tube closing force upon the end portion of each pressure-applying member remote from the pivot axis thereof.

9. The printing plate processing apparatus of claim 8 wherein each control valve means is provided a second shoulder against which the associated pressure-applying member is forced by the resiliency of said resilient backing member when said tube closing force thereon is relieved by said valve-operating means, so that the flexible tube is still under some compression to leave a liquid passage opening in the tube of a desired limited size.

10. The printing plate processing apparatus of claim 9 wherein said second shoulder is progressively adjustable toward and away from the adjacent side of said flexible tube, whereby to progressively vary the degree of partial release of compression on the flexible tube to vary progressively the size of the liquid passage opening therein.

11. A printing plate processing apparatus comprising, in combination: conveyer means having an inlet station for receiving exposed offset printing plates having photosensitive coatings thereon and which have been selectively exposed and for delivering said exposed printing plates to a developing station, a supply container having a storage space therein for holding a supply of chemical having a liquid carrier in which is distributed particles therein which can settle-out therefrom, stirring means for continuously stirring the chemical in said supply container to keep said particles in dispersion within said liquid carrier, means for directing said chemical from said supply container to the printing plates on said conveyor comprising laterally spaced conduit means extending downward from the bottom portion of said storage space for receiving said chemical from said storage space, control valve means associated with each of said conduit means for opening and closing said conduit means, said control valve means associated with each conduit means being driven by motor means which when energized alternately operates the associated control valve means alternately to open or close the conduit means to drop spots of the developing chemical upon the printing plate, printing plate position sensing means responsive to a printing plate being fed to said developing station for operating each control valve means to a position which opens the associated conduit means, and means responsive to said printing plate position sensing means when the printing plate is about to leave said developing station for deenergizing the motor means driving said control valve means only after the motor has returned the control valve means of the various conduit means to a closed position.

12. The printing plate processing apparatus of claim 1 wherein said conduit means are resilient flexible tubes and said control valve means are pinch clamp means for pinching the associated flexible tube closed when applying closing pressure thereto and releiving said closing pressure therefrom when the flexible tube is to be open.

13. The printing plate processing apparatus of claim 12 wherein all of the pinch clamp means are operated by a common rotating cam shaft which extends in operative association therewith, said cam shaft having raised and lower surfaces thereof for respectively applying a pressure against the various flexible tubes simultaneously or releiving closing pressure therefrom simultaneously.

14. A printing plate processing apparatus comprising, in combination: conveyor means having an inlet station for receiving exposed offset printing plates having photosensitive coatings thereon and which have been selectively exposed and for delivering said exposed printing plates to a developing station, a supply container having a storage space therein positioned immediately above said developing station for holding a supply of chemical having a liquid carrier in which is distributed particles therein which can settle-out therefrom, stirring means for continuously stirring the chemical in said supply container to keep said particles in dispersion within said liquid carrier, means for directing said chemical from said supply container to the printing plates on said conveyor comprising laterally spaced conduit means extending downward from the bottom portion of said storage space for receiving said chemical from said storage space by force of gravity, said conduit means being resilient flexible tubes, control valve means comprising pinch clamp means for pinching the associated flexible tube closed when applying closing pressure thereto and relieving said closing pressure therefrom when the flexible tube is to be open, and a common rotating cam shaft having raised and lower surfaces thereof for respectively applying a pressure against the various flexible tubes simultaneously or relieving closing pressure therefrom simultaneously, motor means, said common cam shaft being driven by said motor means which, when energized, continuously rotates said cam shaft to effect alternate opening and closing of said various dispensing tubes to dispense laterally spaced and longitudinally spaced spots of said developing chemical on said printing plate, printing plate position sensing means responsive to a printing plate being fed to said developing station for energizing said motor means, and means responsive to said printing plate position sensing means when the printing plate is about to leave said developing station for de-energizing said motor means driving said cam shaft only after the motor means has returned said cam shaft to a position where the raised portions thereof effect a tube closing pressure upon said flexible tubes.

15. A dispensing valve assembly for dispensing flowable materials having a liquid carrier containing particles which can settle out therein, said dispensing valve assembly comprising, in combination: a resilient flexible dispensing tube having an inlet and an outlet end; and pinch clamp means for selectively closing and opening the dispensing tube, said pinch clamp means comprising a resilient backing member extending along one side of said tube, a first shoulder on said one side of said tube adjacent to said resilient backing member at the outlet end of a portion thereof to be placed under tension and against which shoulder said tube is to be pinched closed, a rigid pressure-applying member confronting said resilient backing member and shoulder on the opposite side of said tube, and valve operating means having a first position forcing said pressure-applying member against said other side of the tube to press the tube against said portion of said resilient backing member to place the same under tension and also against said first shoulder to pinch the tube closed thereat, and a second position for relieving the tube closing force on said pressure-applying member whereby the tension in said resilient backing member is suddenly released to force the adjacent side of the tube inwardly, to shake loose any settled particles in the tube between the previously closed pinched portion thereof and the inlet end of the tube to disperse such settled particles throughout the body of liquid involved.

16. The dispensing valve assembly of claim 15 wherein said first shoulder is progressively adjustable in directions toward and away from said dispensing tube.

17. The dispensing valve assembly of claim 15 wherein said pressure-applying member is pivoted at an end portion thereof remote from said first shoulder, and said valve operating means in said first and second positions respectively applying and releiving said tube closing force upon the end portion of said pressure-applying member remote from the pivot axis thereof.

18. The dispensing valve assembly of claim 17 wherein there is provided a second shoulder against which said pressure-applying member is forced by the resiliency of said resilient backing member when said tube closing force thereon is relieved by said valve-operating means, so that the flexible tube is still under some compression to leave a liquid passage opening in the tube of a desired limited size.

19. The dispensing valve assembly of claim 18 wherein said second shoulder is progressively adjustable toward and away from the adjacent side of said flexible tube, whereby to progressively vary the degree of partial release of compression on the flexible tube to vary progressively the size of the liquid passage opening therein.

20. In a printing plate processing apparatus comprising, in combination, conveyer means having an inlet station for receiving exposed offset printing plates having photosensitive coatings thereon which have been selectively exposed and for delivering said exposed printing plates to a developing station; a supply container above said developing station; said supply container having a cylindrical storage space for holding a supply of chemical having a liquid carrier in which is distributed particles therein which can settle-out therefrom, said cylindrical storage space being oriented so that the longitudinal axis thereof is horizontal, the defining wall surfaces of said storage space presenting a cylindrical wall surface in the bottommost portion thereof into which said particles will settle-out; stirring means in said supply container supported for rotation in a first direction about an axis coaxial with said cylindrical storage space defining wall surfaces of said stirring means including stirring arms movable contiguous to said cylindrical storage space defining wall surfaces wherein said particles which tend to settle-out in the bottom portion of said storage space are kept distributed within said liquid carrier; means for directing said chemical from said supply container to the printing plates on said conveyer means comprising conduit means opening onto the bottom portion of said storage space at a point spaced above the lowermost portions of said storage space where said distributed particles settle-out before the apparatus is placed into operation; and said stirring means being rotated in a direction which moves said stirring arms through the bottommost portion of said storage space while moving in a direction away from the point where said conduit means makes communication with said storage area, so that said stirring arms do not initially push the settled-out particles into said conduit means.

* * * * *